(12) United States Patent
Tappan

(10) Patent No.: US 8,394,233 B2
(45) Date of Patent: Mar. 12, 2013

(54) ELECTRODE ORIENTATION AND PARALLELISM ADJUSTMENT MECHANISM FOR PLASMA PROCESSING SYSTEMS

(75) Inventor: James E. Tappan, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 13/563,931

(22) Filed: Aug. 1, 2012

(65) Prior Publication Data

US 2012/0291954 A1 Nov. 22, 2012

Related U.S. Application Data

(62) Division of application No. 12/167,987, filed on Jul. 3, 2008, now Pat. No. 8,257,548.

(60) Provisional application No. 61/027,372, filed on Feb. 8, 2008, provisional application No. 61/027,405, filed on Feb. 8, 2008.

(51) Int. Cl.
*C23F 1/00* (2006.01)
*H01L 21/306* (2006.01)
*B05C 13/00* (2006.01)
*B05C 13/02* (2006.01)
*C23C 16/00* (2006.01)
*B23K 9/00* (2006.01)
*B23K 9/02* (2006.01)

(52) U.S. Cl. ......... 156/345.54; 156/345.47; 156/345.51; 118/500; 118/723 E; 118/728; 118/729; 219/121.43; 219/121.58

(58) Field of Classification Search ................ None
See application file for complete search history.

(56) References Cited

U.S. PATENT DOCUMENTS

| 3,602,998 A | 9/1971 | Imai et al. |
| 4,044,622 A | 8/1977 | Matthews |
| 5,676,019 A | 10/1997 | Shenk et al. |
| 5,811,021 A | 9/1998 | Zarowin et al. |

(Continued)

FOREIGN PATENT DOCUMENTS

| EP | 0661477 A1 | 7/1995 |
| JP | 6-120169 A | 4/1994 |

(Continued)

OTHER PUBLICATIONS

International Search Report mailed Aug. 18, 2009 for PCT/US2009/033316.

(Continued)

*Primary Examiner* — Dah-Wei D. Yuan
*Assistant Examiner* — Binu Thomas
(74) *Attorney, Agent, or Firm* — Buchanan Ingersoll & Rooney PC

(57) ABSTRACT

A mechanism for adjusting an orientation of an electrode in a plasma processing chamber is disclosed. The plasma processing chamber may be utilized to process at least a substrate, which may be inserted into the plasma processing chamber in an insertion direction. The mechanism may include a support plate disposed outside a chamber wall of the plasma processing chamber and pivoted relative to the chamber wall. The support plate may have a first thread. The mechanism may also include an adjustment screw having a second thread that engages the first thread. Turning the adjustment screw may cause translation of a portion of the support plate relative to the adjustment screw. The translation of the portion of the support plate may cause rotation of the support plate relative to the chamber wall, thereby rotating the electrode with respect to an axis that is orthogonal to the insertion direction.

10 Claims, 12 Drawing Sheets

U.S. PATENT DOCUMENTS

| | | | |
|---|---|---|---|
| 7,858,898 B2 * | 12/2010 | Bailey et al. | 219/121.4 |
| 8,257,548 B2 | 9/2012 | Tappan | |
| 2006/0180968 A1 * | 8/2006 | Kim et al. | 269/51 |
| 2007/0102290 A1 | 5/2007 | Hata et al. | |
| 2009/0199665 A1 | 8/2009 | Tappan | |

FOREIGN PATENT DOCUMENTS

| | | |
|---|---|---|
| JP | 2003-073838 A | 3/2003 |
| JP | 2005-325944 A | 11/2005 |
| WO | WO 2009/100286 A2 | 8/2009 |
| WO | WO 2009/100288 A2 | 8/2009 |

OTHER PUBLICATIONS

Written Opinion mailed Aug. 18, 2009 for PCT/US2009/033316.
International Search Report mailed Aug. 31, 2009 for PCT/US2009/033318.
Written Opinion mailed Aug. 31, 2009 for PCT/US2009/033318.
International Preliminary Report on Patentability mailed Aug. 19, 2010 for PCT/US2009/033316.
International Preliminary Report on Patentability mailed Aug. 19, 2010 for PCT/us2009/033318.

* cited by examiner

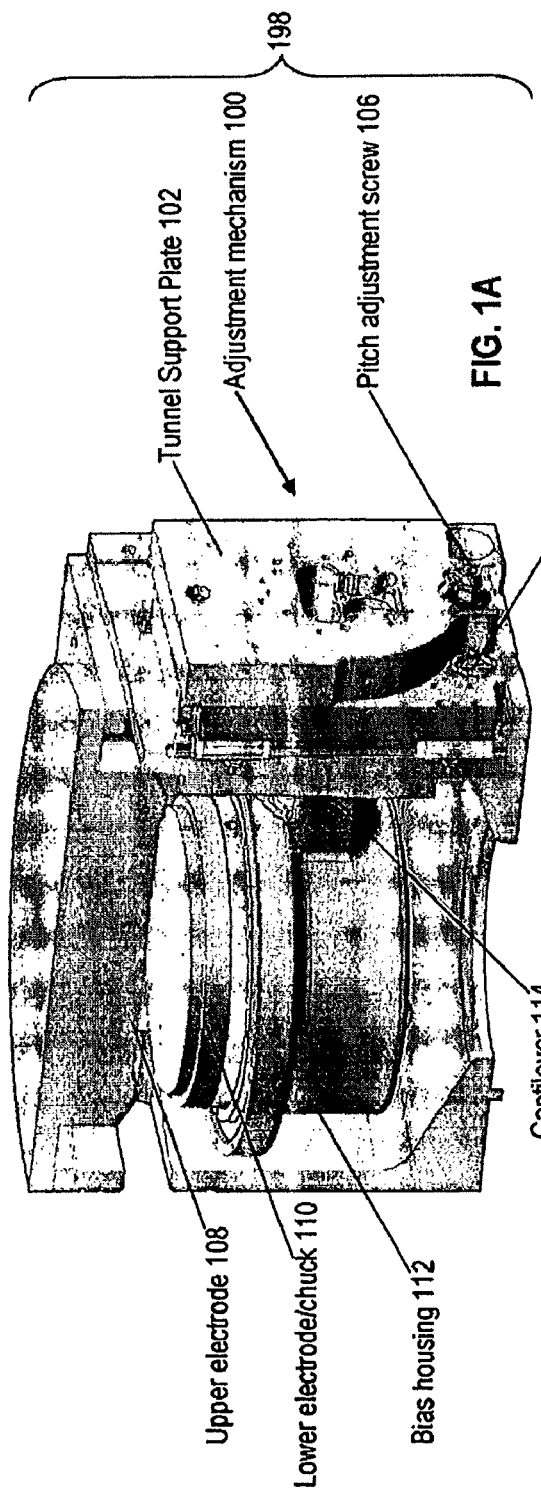
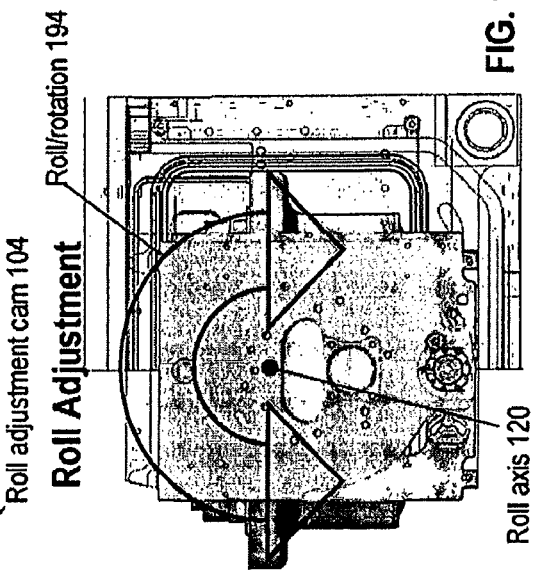
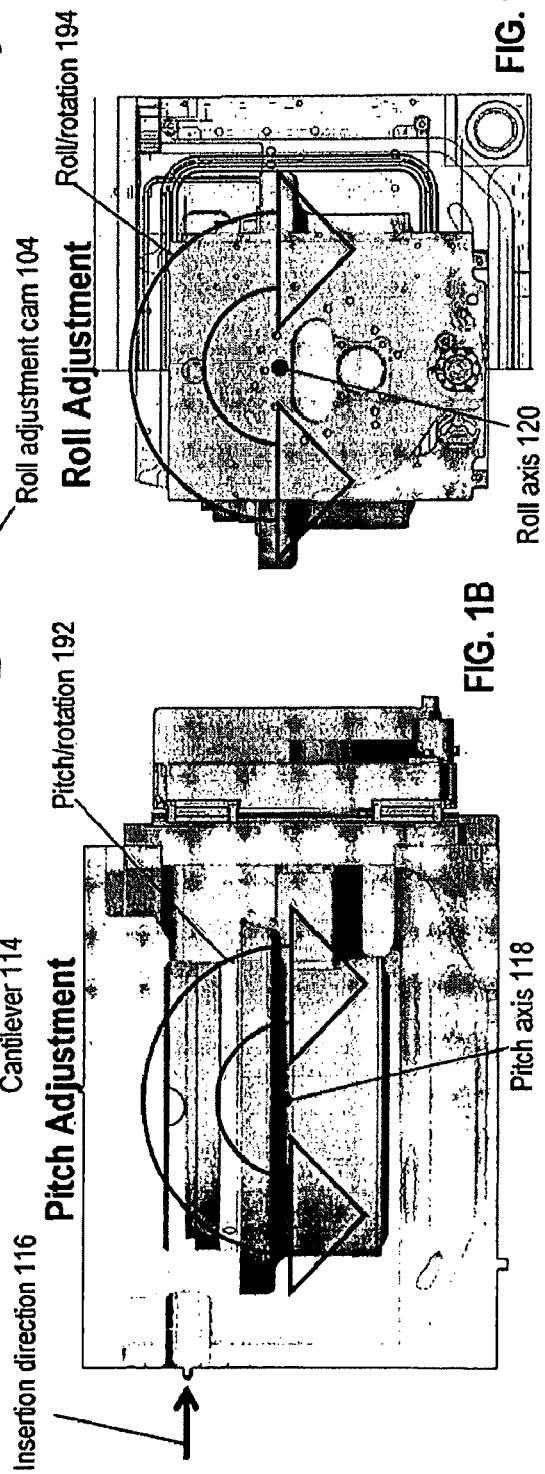

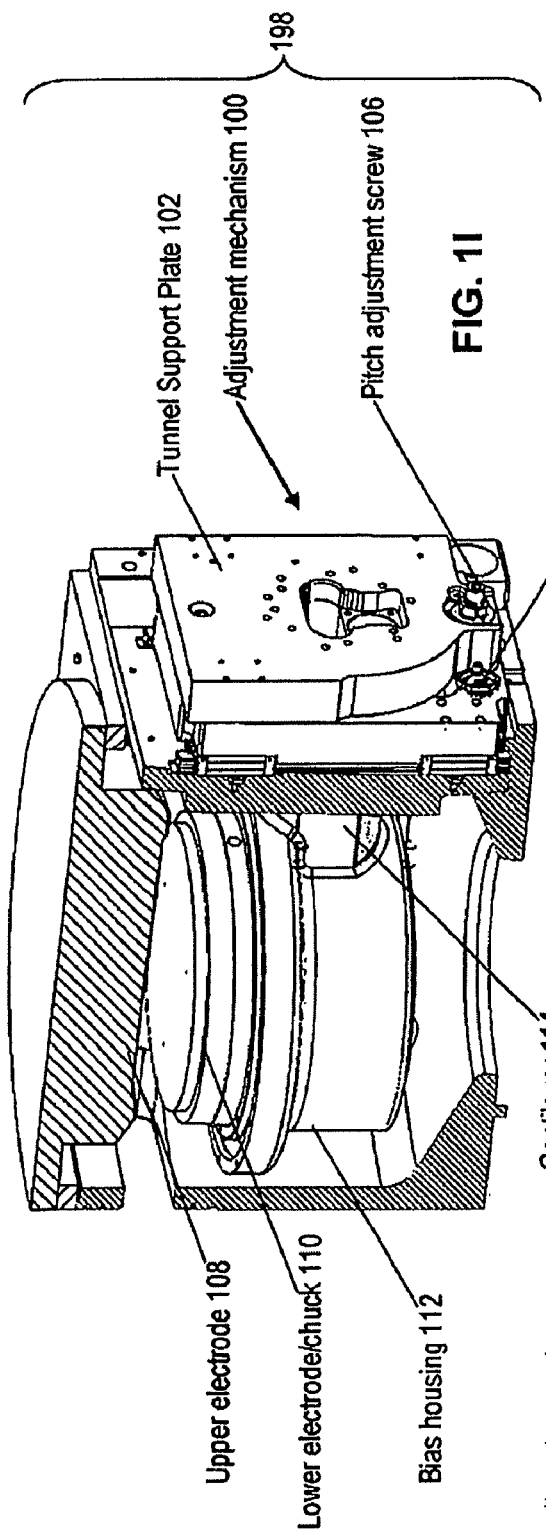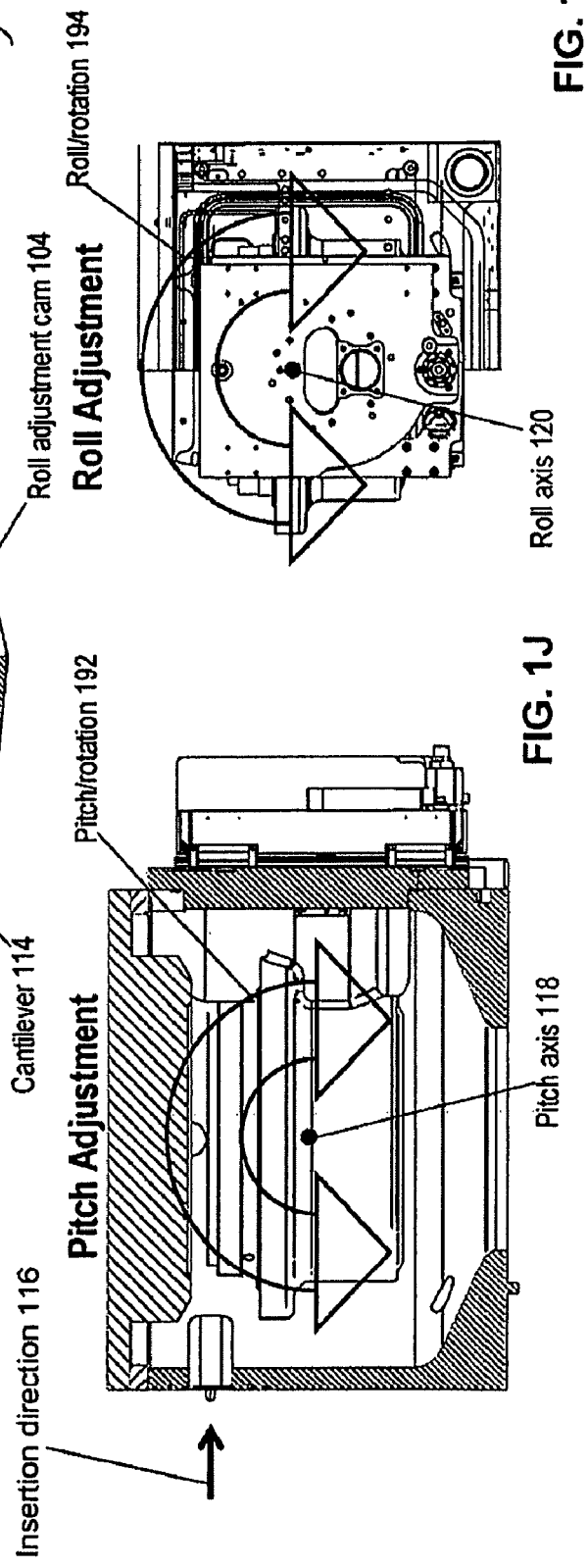
FIG. 1I
FIG. 1J — Pitch Adjustment
FIG. 1K — Roll Adjustment

ELECTRODE ORIENTATION AND PARALLELISM ADJUSTMENT MECHANISM FOR PLASMA PROCESSING SYSTEMS

RELATED APPLICATIONS

This application is a divisional of U.S. patent application Ser. No. 12/167,987, entitled ELECTRODE ORIENTATION AND PARALLELISM ADJUSTMENT MECHANISM FOR PLASMA PROCESSING SYSTEMS, filed Jul. 3, 2008 now U.S. Pat. No. 8,257,548, which claims priority under 35 U.S.C. 119(e) to a commonly owned provisionally filed patent application entitled "ELECTRODE ORIENTATION/PARALLELISM ADJUSTMENT MECHANISM FOR PLASMA PROCESSING SYSTEMS," U.S. Application No. 61/027,372, filed Feb. 8, 2008, by inventor James E. Tappan; and a commonly owned provisionally filed patent application entitled "A FLOATING COLLAR CLAMPING DEVICE FOR AUTO-ALIGNING NUT AND SCREW IN LINEAR MOTION LEADSCREW AND NUT ASSEMBLY," U.S. Application No. 61/027,405, filed Feb. 8, 2008, by inventor James E. Tappan, all of which are incorporated herein by reference.

BACKGROUND OF THE INVENTION

In plasma processing, the shrinking feature sizes and the implementation of new materials in the next generation of device fabrication have put new requirements on plasma processing equipment. The smaller device features, larger substrate size, and new processing techniques (involving multi-step recipes, such as for dual-damascene etch) have increased the challenge to maintain good uniformity across the wafer for better device yields.

In capacitively coupled RF plasma reactors, the electrode opposite to the substrate electrode is generally called the upper electrode. The upper electrode could be grounded, or have one or more radio frequency (RF) power sources attached to it. The substrate electrode is generally called the lower electrode. A mechanical arrangement for a lower electrode in a capacitively coupled plasma processing chamber may involve cantilevering the assembly that includes the lower electrode from a side of the chamber. This cantilevered lower electrode can be a fixed distance from the upper electrode or can be designed for a variable distance from the upper electrode. In either case, parallelism of one electrode surface to the other is generally a critical mechanical parameter that can affect the process performance on the wafer.

Due to added complexity, many capacitively coupled RF plasma reactors forgo the feature of precise parallelism adjustment between electrodes and rely on tight manufacturing tolerances of the assembly components to keep parallelism within acceptable limits. This approach typically adds cost to those components and may limit the ultimate parallelism specification that can be achieved. Other arrangements include slots or clearance holes in mating parts allowing free play to adjust parallelism during assembly. This approach is time consuming and usually requires repetitive processes to achieve the correct configuration. The approach may also require the plasma processing system to be disassembled to some extent to adjust the necessary components. Other methods attempt to provide a means for adjustment, but may have no direct means to correlate the amount of adjustment to the actual effect on at least one of the electrodes. As a result, such methods may also require iterative processes to dial in parallelism. Some of these methods are also vulnerable to shifting of the adjustment over time due to vibrations, such as shipping loads.

SUMMARY

An embodiment of the invention relates to a mechanism for adjusting an orientation of an electrode in a plasma processing chamber. The plasma processing chamber may be utilized to process at least a substrate, which may be inserted into the plasma processing chamber in an insertion direction. The mechanism may include a support plate disposed outside a chamber wall of the plasma processing chamber and pivoted relative to the chamber wall. The support plate may have a first thread. The mechanism may also include an adjustment screw having a second thread that engages the first thread. Turning the adjustment screw may cause translation of a portion of the support plate relative to the adjustment screw. The translation of the portion of the support plate may cause rotation of the support plate relative to the chamber wall, thereby rotating the electrode with respect to an axis that is orthogonal to the insertion direction.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A shows a partial perspective view of a plasma processing chamber including an adjustment mechanism for adjusting the orientation of a lower electrode in the plasma processing chamber in accordance with one or more embodiments of the present invention.

FIG. 1B shows a partial side view of the plasma processing chamber illustrating a first rotation (or the pitch) of the lower electrode in accordance with one or more embodiments of the present invention.

FIG. 1C shows a partial rear view of the plasma processing chamber illustrating a second rotation (or the roll) of the lower electrode in accordance with one or more embodiments of the present invention.

FIG. 1I, another view of FIG. 1A, shows a partial perspective view of the plasma processing chamber including an adjustment mechanism for adjusting the orientation of the lower electrode in the plasma processing chamber in accordance with one or more embodiments of the present invention.

FIG. 1J, another view of FIG. 1B, shows a partial side view of the plasma processing chamber illustrating the first rotation (or the pitch) of the lower electrode in accordance with one or more embodiments of the present invention.

FIG. 1K, another view of FIG. 1C, shows a partial rear view of the plasma processing chamber illustrating the second rotation (or the roll) of the lower electrode in accordance with one or more embodiments of the present invention.

FIG. 1O, another view of FIG. 1G, shows a perspective view of the roll adjustment cam of the adjustment mechanism in accordance with one or more embodiments of the present invention.

DETAILED DESCRIPTION

Figure 1D:
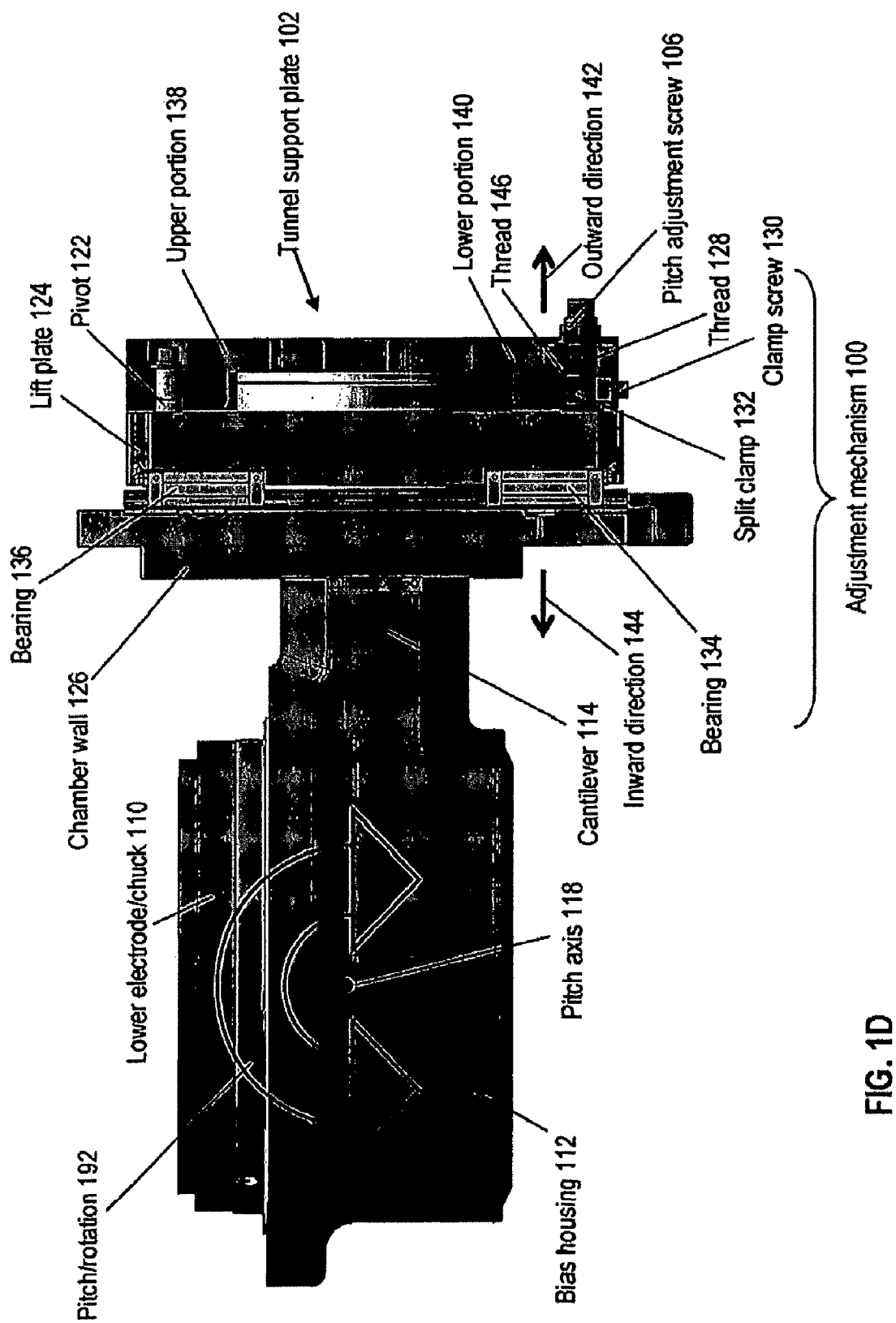
FIG. 1D shows a partial side view of the adjustment mechanism in accordance with one or more embodiments of the present invention.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention relate to a mechanism for adjusting electrode-to-electrode parallelism in a plasma processing system. The mechanism may separately adjust the orientation/rotation of the lower electrode in the pitch (front to back) and roll (side to side) directions. The mechanism may include low-cost, simple parts that collectively accomplish the high-precision adjustment for parallelism with a low combined cost.

The mechanism may allow electrode orientation/parallelism adjustment to take place while the system is under vacuum, at atmosphere, and/or in-situ, since the user interfaces of the mechanism are disposed outside the plasma processing chamber. The mechanism may also allow the adjustment to be made with minimum or no disassembly of the plasma processing system.

The mechanism may enable precise electrode orientation/parallelism adjustment. Precise adjustment of parallelism with accuracy up to 0.01 mm can easily be achieved. The mechanism may also include calibrated index marks to give clear feedback of the amount of adjustment, thereby eliminating the need for iterative adjusting and measuring.

The mechanism may also enable locking electrode orientation/parallelism settings. Once an adjusted electrode orientation/parallelism setting is securely locked down, the setting should stay unchanged through normal vibrations and shipping loads.

By utilizing low-cost parts and allowing fast adjustment-locking of parallelism to a precise level, the mechanism may reducing the need for tight manufacturing tolerances on major components and may cost-effectively optimize process performance with regard to electrode parallelism.

One or more embodiments of the invention relate to a plasma processing system that includes the electrode orientation/parallelism adjustment mechanism discussed above and further discussed in the examples below.

The features and advantages of the present invention may be better understood with reference to the figures and discussions that follow.

FIG. 1A shows a partial perspective view of a plasma processing chamber 198 including a mechanism 100 for adjusting the orientation of a lower electrode 110 in accordance with one or more embodiments of the present invention. For optimizing the processing yield in plasma processing chamber 198, the electrode-to-electrode parallelism between an upper electrode 198 and lower electrode 110 may be ensured by adjusting the orientation of lower electrode 110.

Mechanism 100 may include a tunnel support plate 102 (support plate 102) coupled with lower electrode 110 through a cantilever 114 and a bias housing 112. Mechanism 100 may also include a pitch adjustment screw 106 for adjusting the pitch of lower electrode 110; the pitch of lower electrode 110 is illustrated in the example of FIG. 1B. Mechanism 100 may also include a roll adjustment cam 104 for adjusting the roll of lower electrode 110; the roll of lower electrode 110 is illustrated in the example of FIG. 1C.

FIG. 1B shows a partial side view of plasma processing chamber 198 illustrating a first rotation 192 (pitch 192) in accordance with one or more embodiments of the present invention. Mechanism 100 may facilitate the adjustment of first rotation 192 (pitch 192) of lower electrode 110 with respect to a pitch axis 118. Pitch axis 118 is substantially orthogonal to a substrate insertion direction 116, in which a substrate may be inserted into plasma processing chamber 198.

FIG. 1C shows a partial rear view of plasma processing chamber 198 illustrating a second rotation 194 (roll 194) in accordance with one or more embodiments of the present invention. Mechanism 100 may facilitate the adjustment of second rotation 194 (roll 194) of lower electrode 110 with respect to a roll axis 120. Roll axis 120 is substantially parallel to substrate insertion direction 116

FIG. 1D shows a partial side view of mechanism 100 in accordance with one or more embodiments of the present invention. In mechanism 100, support plate 102 may be disposed outside a chamber wall 126 of plasma processing chamber 198 (shown in the example of FIG. 1A). Support plate 102 may be pivoted relative to chamber wall 126, for example, by pivot 122 and/or another pivot mechanism at a portion 138, e.g., the upper portion, of support plate 102. The support plate may have a thread 146 that may engage a thread 128 of pitch adjustment screw 106. Accordingly, turning pitch adjustment screw 106 may cause the translation of a portion 140 (e.g., the lower portion) of support plate 102 relative to pitch adjustment screw 106 in an outward direction 142 or an inward direction 144. The translation of portion 140 of support plate 102 may cause rotation of support plate 102 with respect to chamber wall 126. Since support plate 102 is coupled with lower electrode 110, the rotation of support plate 102 following direction 142 or 144 may substantially cause rotation of lower electrode 110 with respect to pitch axis 118. The precision of threads 146 and 128 may enable the amount of rotation 192 of lower electrode 110 to be stably and precisely adjusted.

Mechanism 100 may also include a lift plate 124 disposed between chamber wall 126 and support plate 102. Mechanism 100 may also include one or more bearings, such as bearings 134 and 136, coupled with lift plate 124 and chamber wall 126. The one or more bearings may facilitate and/or guide the movement of support plate 102 relative to chamber wall 126 (e.g., translation in direction 142 or 144, and/or translation in a direction perpendicular to direction 142 or 144), for smooth and precise adjustment of rotation 192 of lower electrode 110.

Mechanism 100 may also include a clamping mechanism, for example, including a split clamp 132 and a clamp screw 130, for locking/fastening pitch adjustment screw 106 to support plate 102, thereby preventing pitch adjustment screw 106 from rotation and translation. For example, it may be desirable to have pitch adjustment screw 106 clamped after the pitch adjustment for lower electrode 110 has been completed for locking down the setting. Split clamp 132 may surround pitch adjustment screw 106. Clamp screw 130 may be disposed substantially perpendicular to pitch adjustment screw 106 and may be coupled with split clamp 132 for pressing split clamp 132 to secure pitch adjustment screw 106. A tool slot may be implemented on clamp screw 130 for facilitating the user to rigidly lock/clamp the entire mechanism 100 once the pitch adjustment has been completed.

Figure 1E:
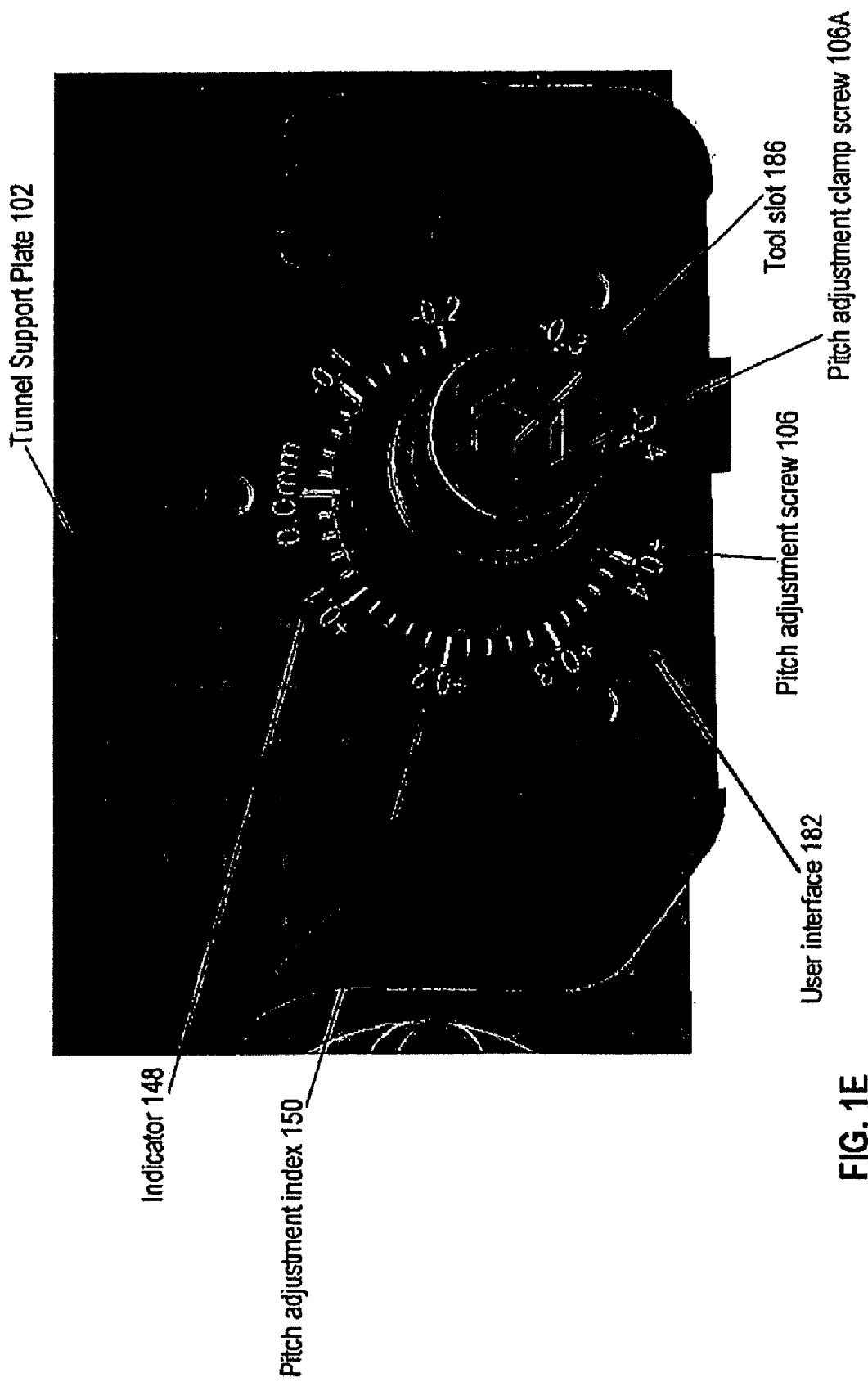
FIG. 1E shows a partial perspective view of a pitch adjustment user interface of the adjustment mechanism in accordance with one or more embodiments of the present invention.

FIG. 1E shows a partial perspective view of a user interface 182 of mechanism 100 for adjusting pitch 192 of lower electrode 110 in accordance with one or more embodiments of the present invention. User interface 182 may include at least one pitch adjustment index 150 implemented on support plate 102 for providing visual feedback concerning pitch adjustment to a user. User interface 182 may also include an indicator 148 implemented on pitch adjustment screw 106 for cooperating with pitch adjustment index 150 to indicate the amount of pitch adjustment. Alternatively or additionally, a pitch adjustment index may be implemented on pitch adjustment screw 106, and/or an indicator may be implemented on support plate 102.

Mechanism 100 may also include a pitch adjustment clamp screw 106A coupled with and at least partially inserted into pitch adjustment screw 106. Pitch adjustment clamp screw 106A may secure pitch adjustment screw 106 to support plate 102. A tool slot 186 may be implemented on a pitch adjustment clamp screw 106A for facilitating the user to rigidly lock/clamp pitch adjustment screw 106 and/or the entire mechanism 100 once the pitch adjustment has been completed.

In one or more embodiment, pitch adjustment screw 106 may be coupled with an automatic control mechanism for controlling the pitch adjustment and/or calibration in an automatic fashion. The automatic control mechanism may include, for example, a sensor, a control logic unit, and a motor (e.g., a high-resolution step motor).

Figure 1F:
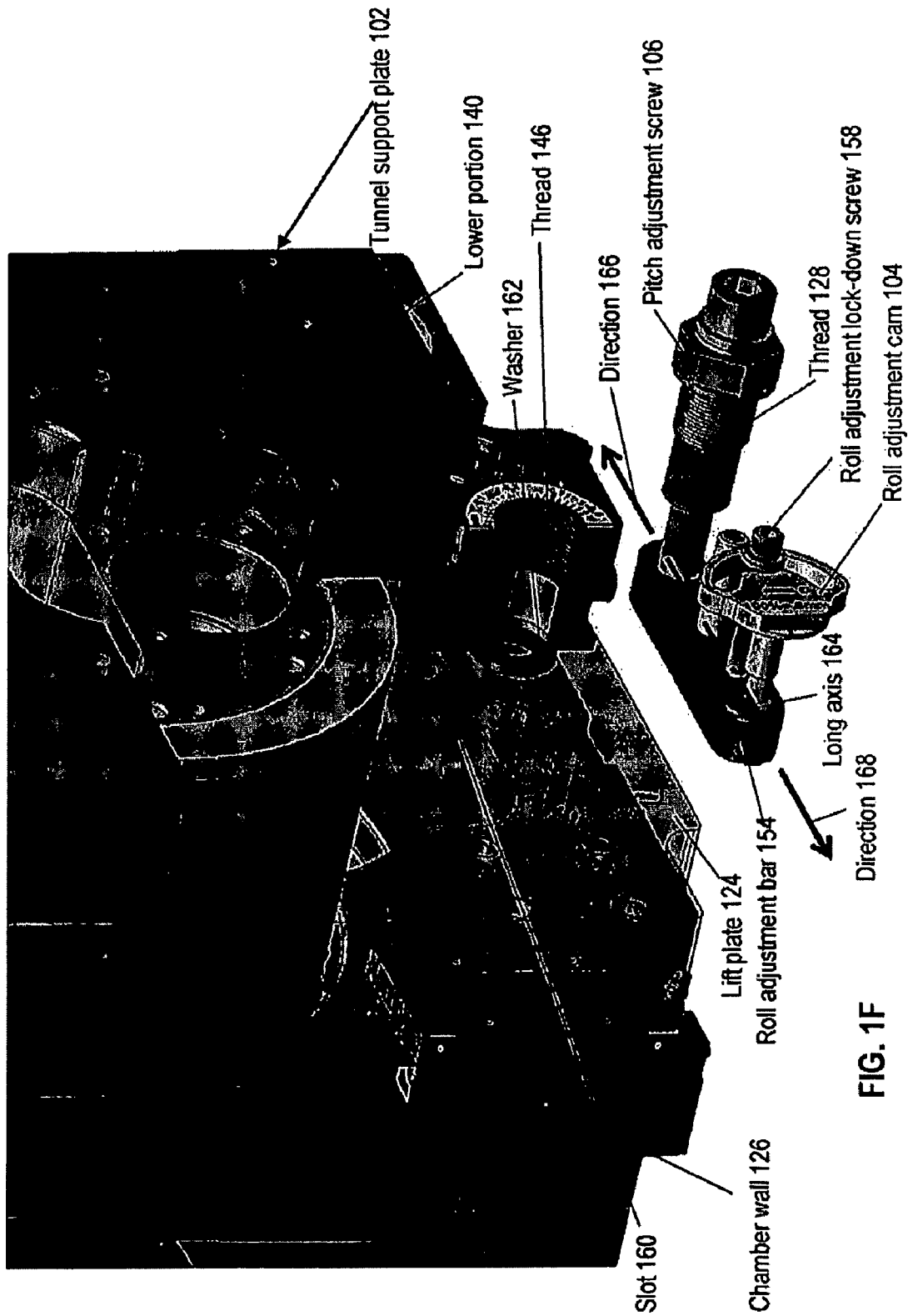
FIG. 1F shows a partial exploded view of the adjustment mechanism in accordance with one or more embodiments of the present invention.

FIG. 1F shows a partial exploded view of mechanism 100 in accordance with one or more embodiments of the present invention. Mechanism 100 may include a roll adjustment bar 154 coupled with roll adjustment cam 104 and may be actuated by roll adjustment cam 104. Roll adjustment bar 154 may be coupled with support plate 102 by pitch adjustment screw 106. Accordingly, through roll adjustment bar 154, roll adjustment cam 104 may actuate translation of portion 140 of support plate 102. As a result, support plate 102 may rotate relative to chamber wall 126 with respect to pivot 122 (shown in the example of FIG. 1D), thereby causing rotation 194 (roll 194) of lower electrode 110 shown in the example of FIG. 1C.

Constrained and guided by slot 160 in lift plate 124, roll adjustment bar 154 may translate along a long axis 164 of roll adjustment bar 154 in direction 166 or 168. Accordingly, the amount of rotation 194 of lower electrode 110 may be stably and precisely adjusted.

Mechanism 100 may also include a roll adjustment lock-down screw 158 coupled with roll adjustment cam 104. Roll adjustment lock-down screw 158 may lock roll adjustment cam 104 relative to roll adjustment bar 154 and may simultaneously lock roll adjustment bar 154 relative to lift plate 124, thereby preventing (further) rotation 194 (roll 194) of lower electrode 110. Roll adjustment lock-down screw 158 may be utilized, for example, after roll adjustment for lower electrode 110 has been completed.

Mechanism 100 may also include a washer 162 (e.g., a precision, hardened washer) coupled with lift plate 124 for receiving pitch adjustment screw 106. Washer 162 may protect lift plate 124 from being damaged by pitch adjustment screw 106. Washer 162 may also provide low friction to facilitate smooth movement of pitch adjustment screw 106, thereby further smoothing and stabilizing the operation of mechanism 100.

Figure 1G:
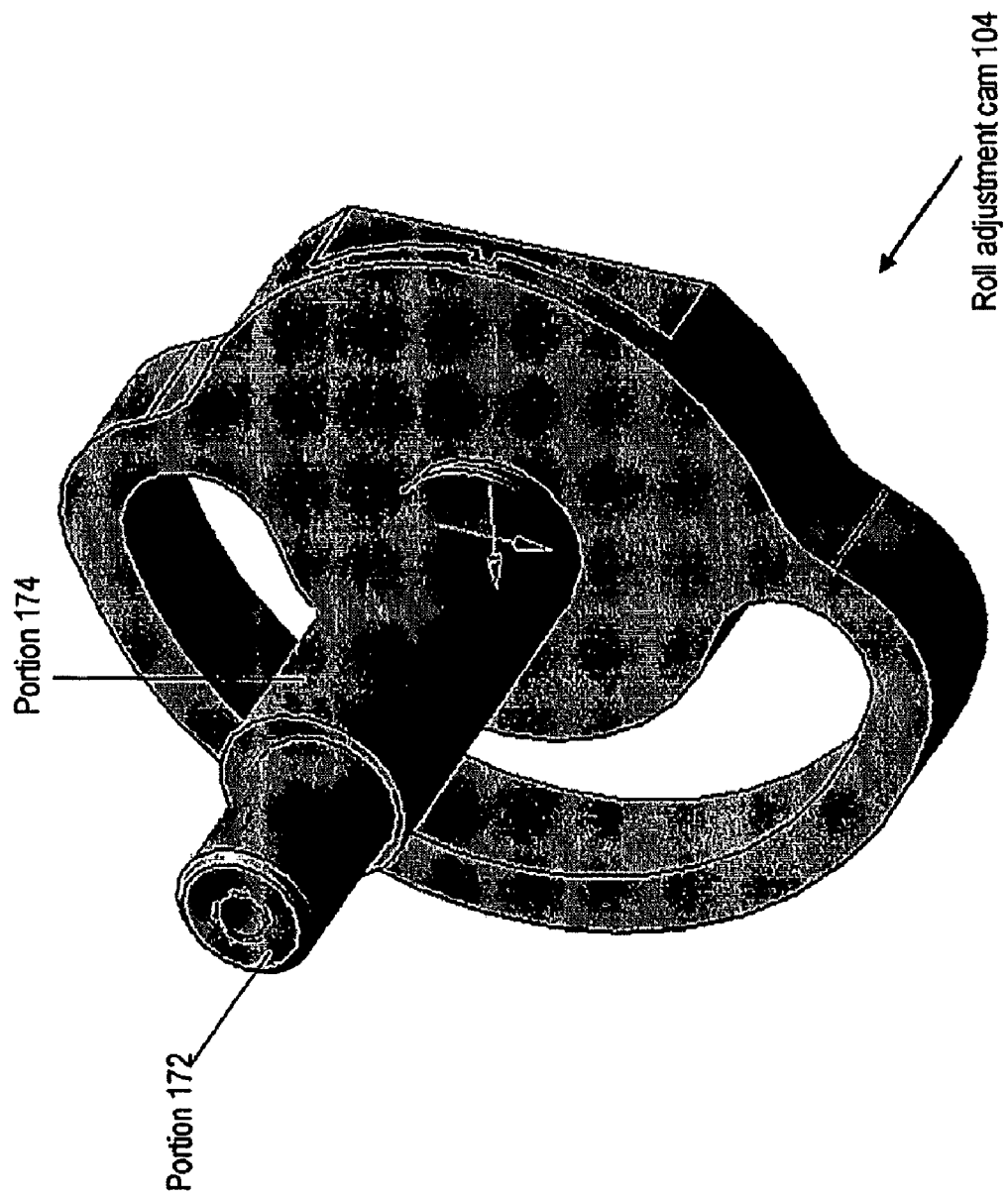
FIG. 1G shows a perspective view of a roll adjustment cam of the adjustment mechanism in accordance with one or more embodiments of the present invention.

FIG. 1G shows a perspective view of roll adjustment cam 104 in accordance with one or more embodiments of the present invention. Roll adjustment cam 104 may include a portion 172 disposed in an eccentric/offset arrangement with respect to a portion 174 of roll adjustment cam 104, for enabling roll adjustment cam 104 to actuate roll adjustment bar 154 (shown in the example of FIG. 1F). Roll adjustment cam 104 may be replaced with other replacement roll adjustment cams with different eccentric/offset arrangements for particular actuation effects that suit particular roll adjustment needs.

Figure 1H:
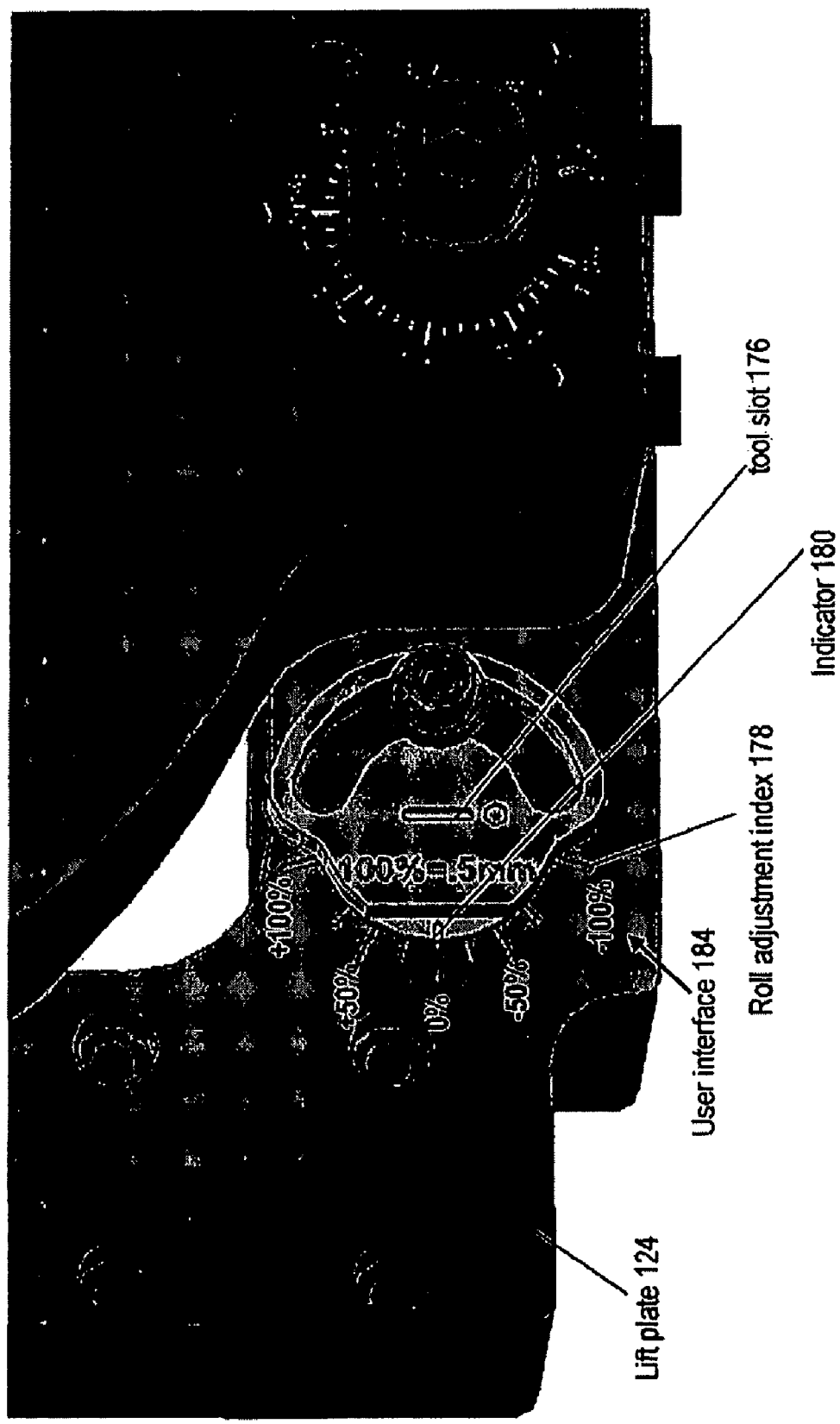
FIG. 1H shows a partial perspective view of a roll adjustment user interface of the adjustment mechanism in accordance with one or more embodiments of the present invention.
Figure 1L:
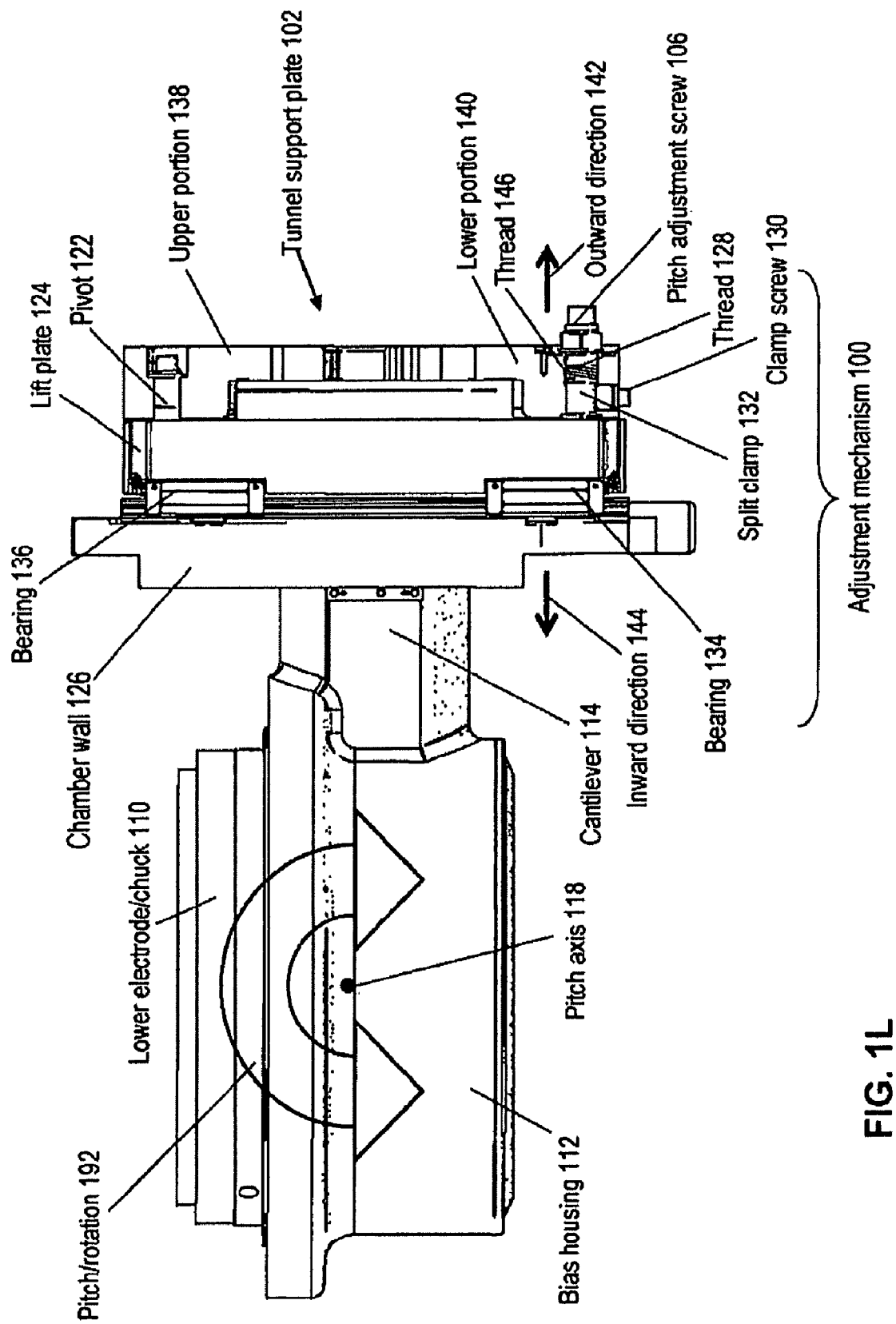
FIG. 1L, another view of FIG. 1D, shows a partial side view of the adjustment mechanism in accordance with one or more embodiments of the present invention.
Figure 1M:
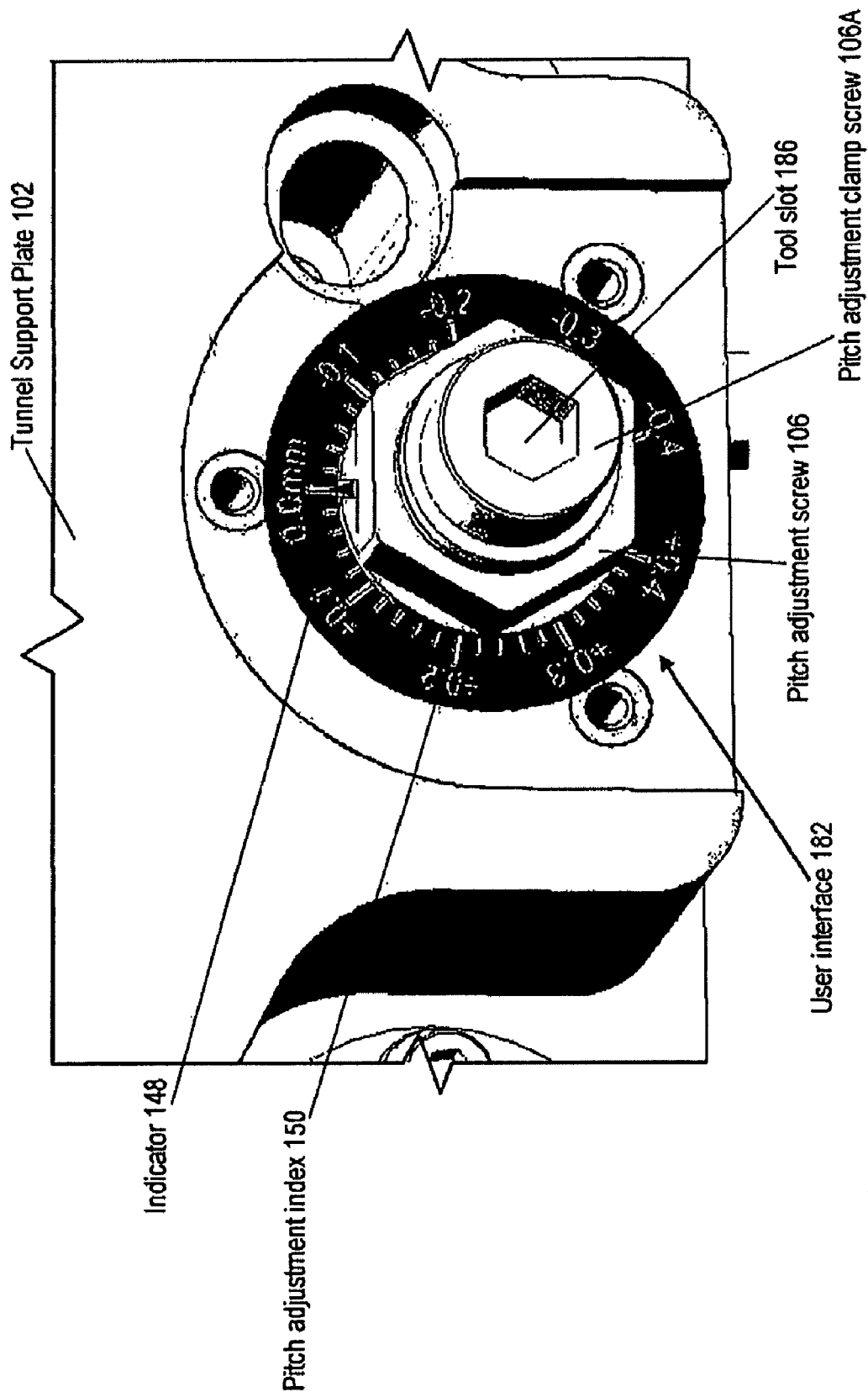
FIG. 1M, another view of FIG. 1E, shows a partial perspective view of the pitch adjustment user interface of the adjustment mechanism in accordance with one or more embodiments of the present invention.
Figure 1N:
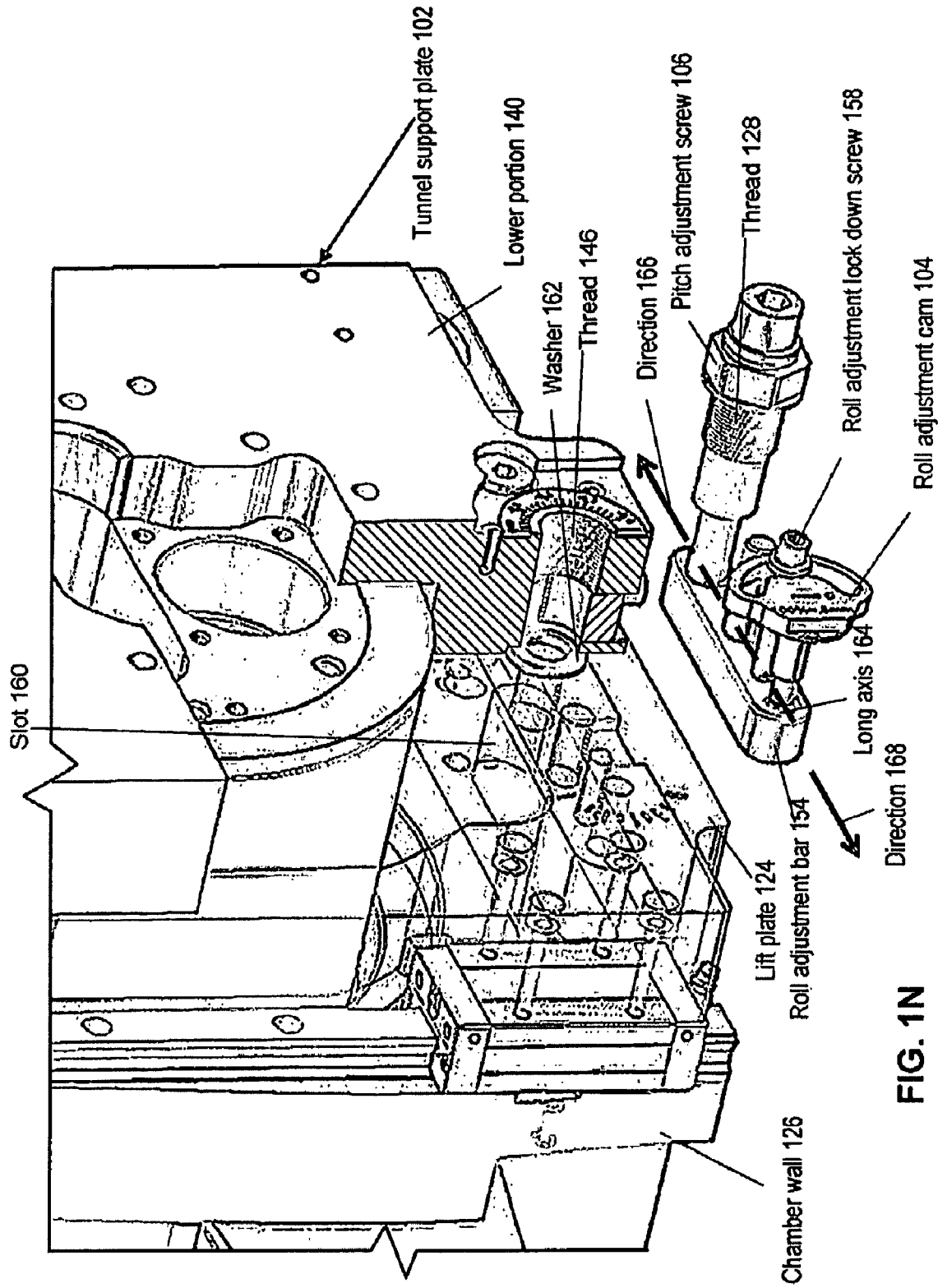
FIG. 1N, another view of FIG. 1F, shows a partial exploded view of the adjustment mechanism in accordance with one or more embodiments of the present invention.
Figure 10:
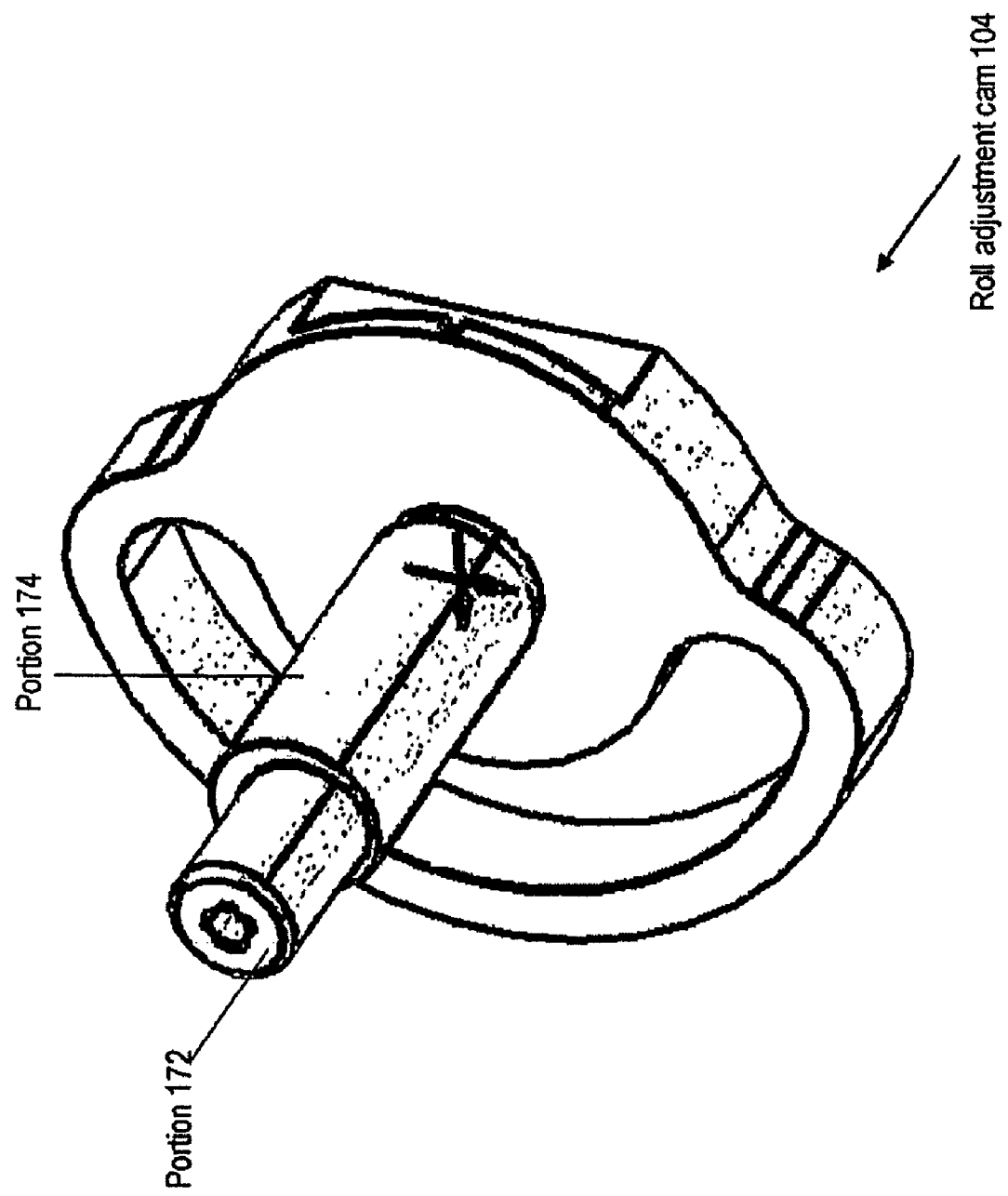
Figure 1P:
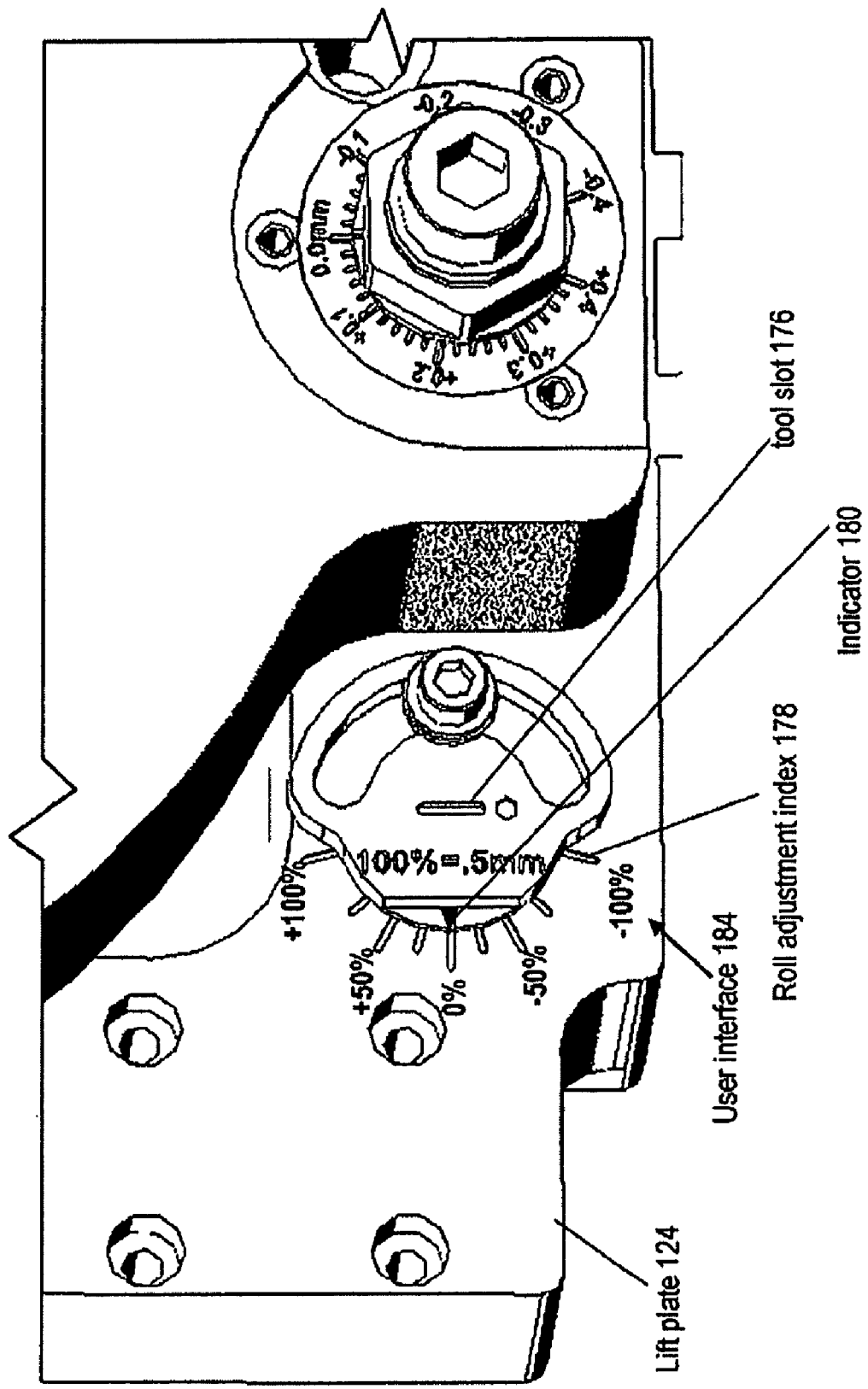
FIG. 1P, another view of FIG. 1H, shows a partial perspective view of the roll adjustment user interface of the adjustment mechanism in accordance with one or more embodiments of the present invention.

FIG. 1H shows a partial perspective view of a user interface 184 mechanism 100 for adjusting roll 194 of lower electrode 110 in accordance with one or more embodiments of the present invention. User interface 184 may include at least one roll adjustment index 178 implemented on lift plate 124 for providing visual feedback concerning roll adjustment to a user. User interface 184 may also include an indicator 180 implemented on roll adjustment cam 104 for cooperating with roll adjustment index 178 to indicate the amount of roll adjustment. Alternatively or additionally, a roll adjustment index may be implemented on roll adjustment cam 104, and/or an indicator may be implemented on lift plate 124. A tool slot 176 may be implemented on roll adjustment cam 104 for facilitating the user to perform the roll adjustment, for example, utilizing a screw driver.

In one or more embodiment, roll adjustment cam 104 and/or pitch adjustment screw 106 may be coupled with an automatic control mechanism for controlling pitch and/or roll adjustment and/or calibration in an automatic fashion. The automatic control mechanism may include, for example, a sensor, a control logic unit, and a motor (e.g., a high-resolution step motor).

As can be appreciated from the foregoing, with low-cost parts, embodiments of the invention may allow fast adjustment and locking of parallelism to a precise level. Accordingly, embodiments of the invention may reduce the need for costly tight manufacturing tolerances on major components. Advantageously, embodiments of the invention may cost-effectively optimize process performance with regard to electrode parallelism.

Embodiments of the invention may enable precise electrode orientation/parallelism adjustment. Embodiments of the invention may also include calibrated index marks to give clear feedback of the amount of adjustment. Advantageously, the need for iterative adjusting and measuring required in the prior art may be eliminated.

Embodiments of the invention may allow the adjustment of electrode orientation and/or parallelism to take place while a plasma processing system is under vacuum, atmosphere, and/or in-situ, since the user interfaces are disposed outside the plasma processing chamber. Embodiments of the invention may also allow the adjustment to be made with minimum or no disassembly of the plasma processing system. Advantageously, system down time may be minimized, and productivity may not be compromised, while the needs for electrode orientation and/or parallelism adjustment are satisfied.

Embodiments of the invention may also enable locking the settings of electrode orientation/parallelism. An adjusted electrode orientation/parallelism setting may stay unchanged through normal vibrations and shipping loads. Advantageously, the resources (e.g., labor, time, etc.) required for the re-adjustment of electrode orientation/parallelism may be minimized.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section may be provided herein for convenience and, due to word count limitation, may be accordingly written for reading convenience and should not be employed to limit the scope of the claims. It may be therefore intended that the following appended claims be interpreted as including all such alternations, permutations, and equivalents as fall within the true spirit and scope of the present invention.

What is claimed is:

1. A mechanism for adjusting an orientation of a first electrode in a plasma processing system, the plasma processing system configured for processing at least a substrate, the plasma processing system further including at least a plasma processing chamber, the plasma processing chamber including at least a chamber wall, the first electrode positioned inside the plasma processing chamber, the substrate configured to be inserted into the plasma processing chamber in an insertion direction, the mechanism comprising:
  a support plate coupled with the first electrode, the support plate having a first thread, the support plate disposed outside the chamber wall and pivoted relative to the chamber wall;
  a cam coupled with the support plate, the cam configured to cause a first translation of a portion of the support plate relative to the chamber wall, thereby causing a first rotation of the support plate relative to the chamber wall, the first rotation of the support plate configured to cause a first rotation of the first electrode with respect to a first axis that is parallel to the insertion direction;
  a bar coupled with the cam and coupled with the support plate, the bar configured to be actuated by the cam; and
  a lift plate disposed between the chamber wall and the support plate, the lift plate including at least a slot coupled with the bar, the slot configured to guide and limit movement of the bar, thereby limiting the first rotation of the first electrode.

2. The mechanism of claim 1 further comprising a lock-down screw coupled with the cam, the lock-down screw configured to lock the cam to the bar, the lock-down screw further configured to lock the bar to the lift plate.

3. The mechanism of claim 1, further comprising:
  an adjustment screw having a second thread, the second thread engaging the first thread for pitch adjustment, wherein turning the adjustment screw causes a second translation of a portion of the support plate relative to the adjustment screw, the second translation of the portion of the support plate configured to cause a second rotation of the support plate inward or outward relative to the chamber wall, the second rotation of the support plate configured to cause a second rotation of the first electrode with respect to a second axis that is orthogonal to the insertion direction.

4. The mechanism of claim 3 further comprising a first clamp screw coupled with the adjustment screw and at least partially inserted into the adjustment screw, the first clamp screw configured to secure the adjustment screw to the support plate.

5. The mechanism of claim 4 further comprising:
  a clamp coupled with the adjustment screw; and
  a second clamp screw disposed perpendicular to the adjustment screw, the second clamp screw coupled with the clamp, the second clamp screw configured to press the clamp to fasten the adjustment screw to the support plate.

6. The mechanism of claim 3 further comprising:
  a first index implemented on the support plate for providing visual feedback concerning the second rotation of the first electrode; and
  a first indicator implemented on the adjustment screw for cooperating with the first index to indicate an amount of the second rotation of the first electrode.

7. The mechanism of claim 3 further comprising:
  a first index implemented on the adjustment screw for providing visual feedback concerning the second rotation of the first electrode; and
  a first indicator implemented on the support plate for cooperating with the first index to indicate an amount of the second rotation of the first electrode.

8. The mechanism of claim 1 further comprising:
  one or more bearings coupled with the lift plate and coupled with the chamber wall, the one or more bearings configured to guide at least the second translation of the portion of the support plate.

9. The mechanism of claim 8 further comprising a washer coupled with the support plate, the washer configured to receive the adjustment screw, the washer further configured to protect the lift plate from being damaged by the adjustment screw, the washer further configured to smoothen movement of the adjustment screw.

10. The mechanism of claim 3 further comprising a control unit coupled with the adjustment screw and the cam, the control unit configured to automatically adjust the first rotation of the first electrode and the second rotation of the first electrode.

* * * * *